United States Patent
Lu

(10) Patent No.: US 7,888,157 B2
(45) Date of Patent: Feb. 15, 2011

(54) IMAGE SENSOR CHIP PACKAGE METHOD

(75) Inventor: Chih-Wei Lu, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/836,807

(22) Filed: Jul. 15, 2010

(65) Prior Publication Data
US 2010/0279452 A1    Nov. 4, 2010

Related U.S. Application Data

(62) Division of application No. 12/183,378, filed on Jul. 31, 2008, now Pat. No. 7,781,854.

(51) Int. Cl.
    *H01L 21/00* (2006.01)
(52) U.S. Cl. .............. 438/57; 438/64; 438/74; 438/108; 257/E21.499
(58) Field of Classification Search .......... 438/64, 438/57, 67, 74, 108; 257/E21.499
    See application file for complete search history.

(56) References Cited

U.S. PATENT DOCUMENTS

| | | | |
|---|---|---|---|
| 7,341,881 B2 * | 3/2008 | Watkins et al. | 438/26 |
| 7,368,695 B2 * | 5/2008 | Kang et al. | 250/208.1 |
| 7,528,420 B2 * | 5/2009 | Weng et al. | 257/98 |
| 2006/0086899 A1 * | 4/2006 | Chao et al. | 250/239 |
| 2006/0231750 A1 * | 10/2006 | Chao et al. | 250/239 |

* cited by examiner

*Primary Examiner*—Michael Trinh
(74) *Attorney, Agent, or Firm*—J.C. Patents

(57) ABSTRACT

In an image sensor chip package method, a transparent substrate having an upper surface, a lower surface, and through holes is provided. The through holes pass through the transparent substrate. Conductive posts are formed in the through holes. A sealing ring is formed on the lower surface of the transparent substrate. A chip having an active surface, an image sensitive area, and die pads is provided. The image sensitive area and the die pads are located on the active surface. Conductive bumps are formed and respectively disposed on the die pads for respectively connecting the conductive posts. At the time the active surface of the chip is turned to face toward the lower surface of the transparent substrate. The chip is assembled to the transparent substrate and electrically connected with the conductive posts via the die pads. The sealing ring surrounds the image sensitive area and the die pads.

11 Claims, 7 Drawing Sheets

IMAGE SENSOR CHIP PACKAGE METHOD

CROSS-REFERENCE TO RELATED APPLICATION

This application is a divisional of an application Ser. No. 12/183,378, filed on Jul. 31, 2008, U.S. Pat. No. 7,781,854, now pending. The entirety of each of the above-mentioned patent applications is hereby incorporated by reference herein and made a part of this specification.

BACKGROUND OF THE INVENTION

1. Field of the Invention

The invention relates to a semiconductor package method. More particularly, the invention relates to an image sensor chip package method.

2. Description of Related Art

With a rapid progress in multimedia, digital images are extensively applied, and therefore demands for image processing devices are increasing. Currently, various digital image products including web cameras, digital cameras, optical scanners, and image phones employ image sensors for retrieving images. The image sensor includes a CCD image sensor chip and a CMOS image sensor chip that are capable of receiving light emitted by scene and transmitting the light into digital signals. The image sensor chips require light sources for receiving, and accordingly a package method of these image sensor chips is different from a package method of normal electronic products.

The conventional package technology applied to the image sensor chips mostly includes a plastic leadless chip carrier (PLCC) technology or a ceramic leadless chip carrier (CLCC) technology. For instance, the conventional image sensor chip package structure formed by applying the CLCC technology includes a ceramic base, an image sensor chip, and a glass cover plate. The image sensor chip is disposed on the ceramic base and electrically connected with the ceramic base by wire bonding. Besides, the glass cover plate is assembled to the ceramic base, and the glass cover plate and the ceramic base together form a sealed space for accommodating the image sensor chip, such that the image sensor chip and wires are protected. On the other hand, light is able to be transmitted to the image sensor chip through the glass cover plate.

SUMMARY OF THE INVENTION

The invention is directed to an image sensor chip package method by which volume and thickness of an image sensor chip package structure can be reduced.

The invention provides an image sensor chip package method. In the method, a transparent substrate is provided. The transparent substrate has an upper surface, a lower surface, and a plurality of through holes, wherein the through holes pass through the transparent substrate. A plurality of conductive posts are formed in the through holes. A sealing ring is formed on the lower surface of the transparent substrate. A chip is provided. The chip has an active surface, an image sensitive area, and a plurality of die pads, wherein the image sensitive area and the die pads are located on the active surface. A plurality of conductive bumps are formed. The conductive bumps are respectively disposed on the die pads for respectively connecting the conductive posts. At the time the active surface of the chip is turned to face toward the lower surface of the transparent substrate, the chip is assembled to the transparent substrate, the chip is electrically connected with the conductive posts via the die pads, and the sealing ring surrounds the image sensitive area and the die pads.

According to an embodiment of the invention, before the conductive posts are formed, the method further includes forming a conductive layer in the through holes and on the upper surface and the lower surface of the transparent substrate. Besides, a plurality of posts are formed in the through holes that are respectively filled with the posts. Moreover, a sputtering process and an electroplating process are performed through the conductive layer for forming the conductive posts.

According to an embodiment of the invention, a method of forming the conductive layer includes sputtering.

According to an embodiment of the invention, a material of the conductive layer includes TiW and copper.

According to an embodiment of the invention, the step of forming the conductive posts in the through holes includes forming a photoresist layer on a metal layer through the conductive layer. An exposure and development process is performed on the photoresist layer to form a patterned photoresist layer. The metal layer outside the patterned photoresist layer is etched with use of the patterned photoresist layer as an etching mask, so as to form the conductive posts. The patterned photoresist layer is removed. Parts of the conductive layer are removed, wherein said parts of the conductive layer are respectively located on the upper surface and the lower surface of the transparent substrate.

According to an embodiment of the invention, the step of forming the sealing ring on the lower surface of the transparent substrate includes forming a supporting layer on the lower surface of the transparent substrate. The supporting layer is patterned to form the sealing ring surrounding the lower surface of the transparent substrate.

According to an embodiment of the invention, a material of the supporting layer includes benzocyclobutene (BCB).

According to an embodiment of the invention, a material of end portions of the conductive posts includes gold.

According to an embodiment of the invention, a material of the transparent substrate includes glass.

According to an embodiment of the invention, the metal layer is a composite layer. A material of the metal layer includes a TiW layer and a copper layer or a TiW layer and a gold layer.

Based on the above, the chip is electrically connected with the conductive posts of the transparent substrate through the die pads or the conductive bumps disposed on the die pads according to the invention. Thereby, space required by the conventional wire bonding can be reduced, and the entire volume and thickness of the image sensor chip package structure can also be decreased. Moreover, in the invention, the transparent substrate is directly bonded to the chip for forming a chip size package (CSP), which is further conducive to reducing the entire volume and thickness of the image sensor chip package structure.

In order to make the above and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
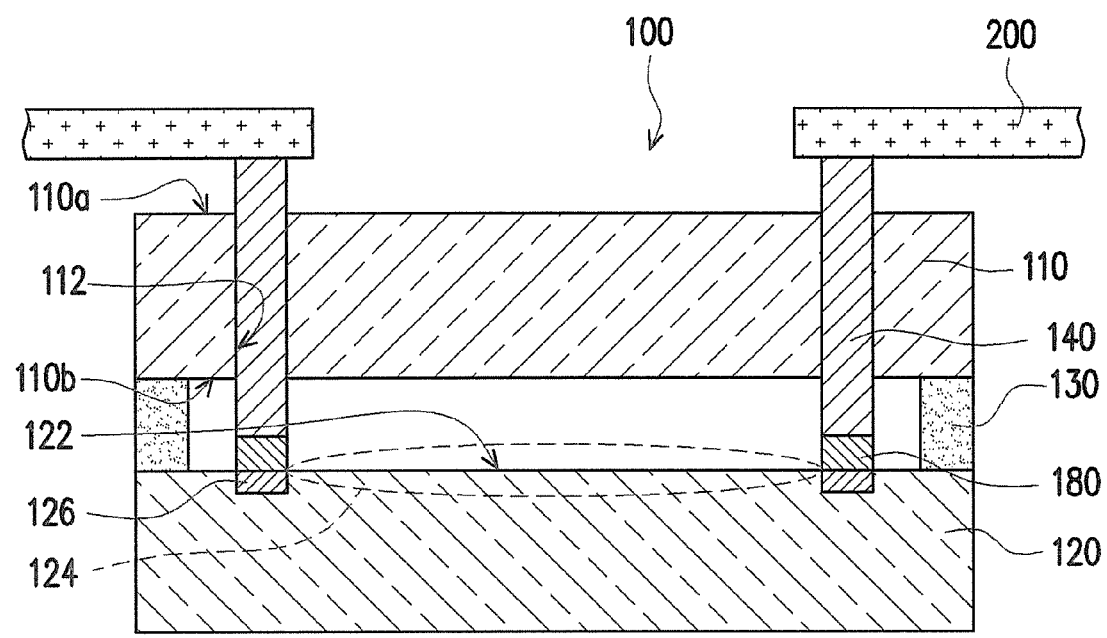
FIG. 1 is a schematic view of an image sensor chip package structure according to one embodiment of the invention.

FIG. 1 is a schematic view of an image sensor chip package structure according to one embodiment of the invention. Referring to FIG. 1, an image sensor chip package structure 100 of the present embodiment includes a transparent substrate 110, a chip 120, a sealing ring 130, and a plurality of conductive posts 140. The transparent substrate 110 is, for example, a glass substrate with a thickness of 0.3 mm. The transparent substrate 110 has an upper surface 110a, a lower surface 110b, and a plurality of through holes 112. The through holes 112 pass through the transparent substrate 110 to connect the upper surface 110a with the lower surface 110b. In the present embodiment, diameters of the through holes 112 are, for example, 0.1 mm-0.2 mm.

The chip 120 has an active surface 122, an image sensitive area 124, and a plurality of die pads 126. The image sensitive area 124 and the die pads 126 are located on the active surface 122. In the present embodiment, the chip 120 can be a CMOS image sensor chip or a CCD image sensor chip.

The sealing ring 130 is disposed between the chip 120 and the transparent substrate 110 and surrounds the image sensitive area 124 and the die pads 126. The sealing ring 130, the chip 120, and the transparent substrate 110 together form a sealed space for protecting the image sensitive area 124 of the chip 120. In the present embodiment, a material of the sealing ring 130 is, for example, benzocyclobutene (BCB).

The conductive posts 140 are disposed in the through holes 112, respectively. Here, the chip 120 is electrically connected with the conductive posts 140 via the die pads 126. In the present embodiment, end portions of the conductive posts 140 are made of gold.

In the present embodiment, the image sensor chip package structure 100 further includes a plurality of conductive bumps 180. The conductive bumps 180 are respectively disposed on the die pads 126 and are respectively connected with the conductive posts 140. According to the present embodiment, the conductive bumps 180 are made of gold, and the thickness of the conductive bumps 180 is, for example, 10 μm~20 μm. Additionally, the material of the conductive bumps 180 and that of the conductive posts 140 can be the same, or the material of the conductive bumps 180 can be solder (e.g. tin or lead tin), such that the chip 120 and the transparent substrate 110 can be reliably bonded.

In brief, the conductive bumps 180 disposed on the die pads 126 of the chip 120 are electrically connected with the conductive posts 140 of the transparent substrate 110 in the image sensor chip package structure 100 of the present embodiment. Thereby, space required by the conventional wire bonding can be reduced. Besides, the transparent substrate 110 and the chip 120 are directly bonded to form a CSP and, therefore, the entire volume and thickness of the image sensor chip package structure 100 can also be decreased. Finally, the image sensor chip package structure 100 can be connected with a flexible circuit board 200 through end portions of the conductive posts 140, wherein said end portions of the conductive posts 140 are away from the chip 120.

Figure 2:
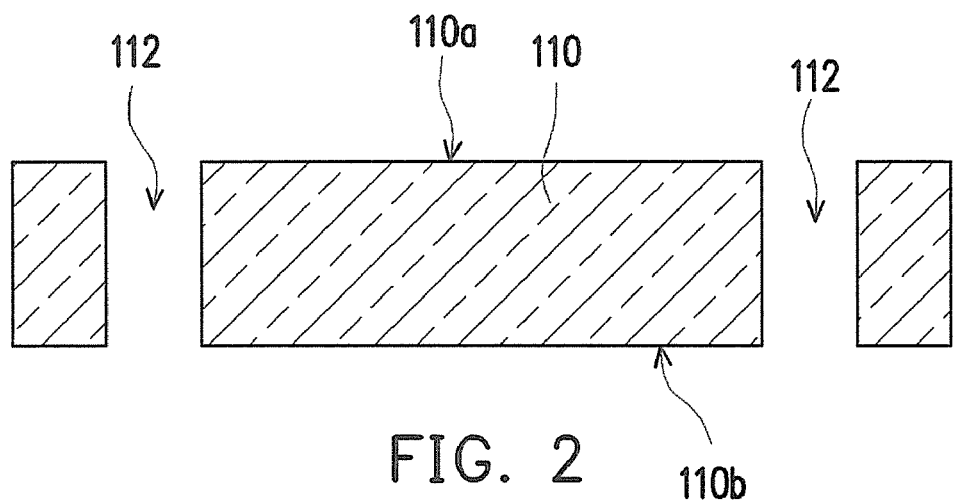
FIGS. 2 through 14 illustrate an image sensor chip package method according to one embodiment of the invention.

FIGS. 2 through 14 illustrate an image sensor chip package method according to one embodiment of the invention. Referring to FIG. 2, in the image sensor chip package method of the present embodiment, a transparent substrate 110 is provided at first. The transparent substrate 110 has an upper surface 110a, a lower surface 110b opposite to the upper surface 110a, and a plurality of through holes 112. The through holes 112 pass through the transparent substrate 110 and are connected with the upper surface 110a and the lower surface 110b of the transparent substrate 110, respectively.

Figure 3:
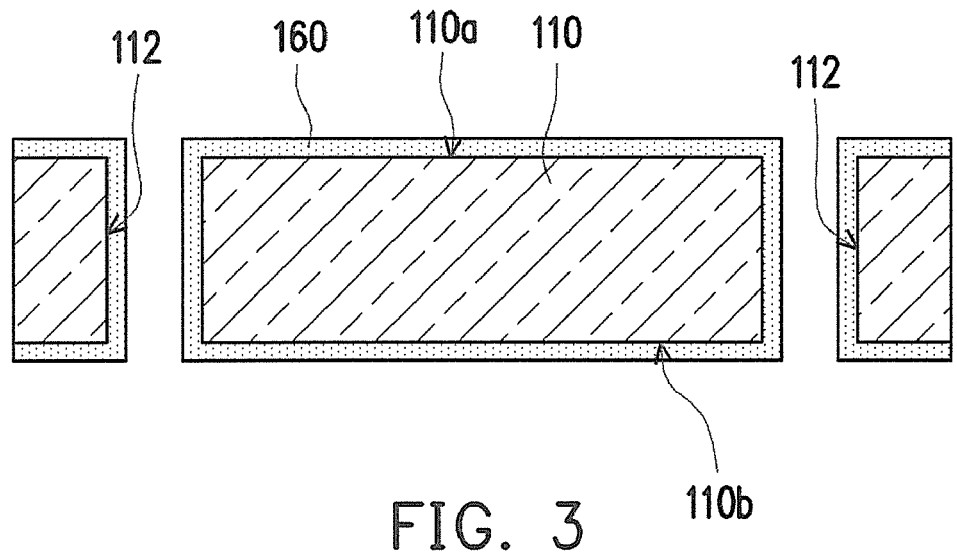

Referring to FIG. 3, a conductive layer 160 is then formed in the through holes 112 and on the upper surface 110a and the lower surface 110b of the transparent substrate 110. The conductive layer 160 can be formed by sputtering, and a material of the conductive layer 160 can be TiW having a thickness of 800 Å~1000 Å and copper having a thickness of 2000 Å~3000 Å.

Figure 4:
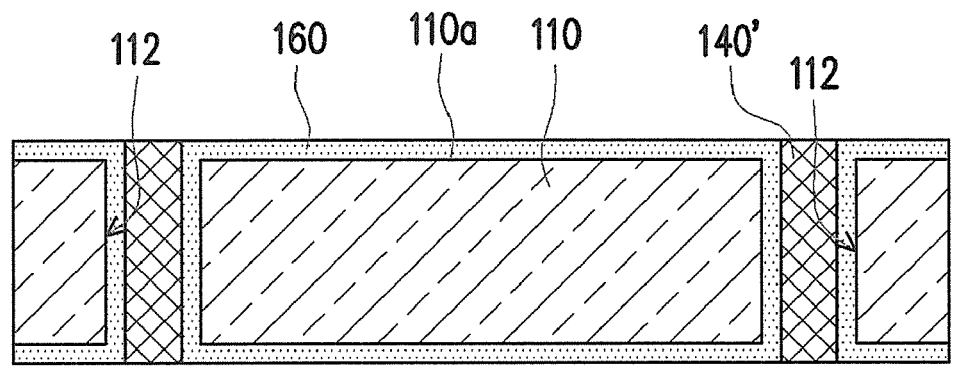

Next, as shown in FIG. 4, the through holes 112 are completely filled with epoxy by vacuum printing, so as to form a plurality of posts 140'. Specifically, the posts 140' are respectively disposed within the through holes 112. Two ends of the posts 140' are substantially aligned with the conductive layer 160 formed on the upper surface 110a and the lower surface 110b of the transparent substrate 110.

Figure 5:
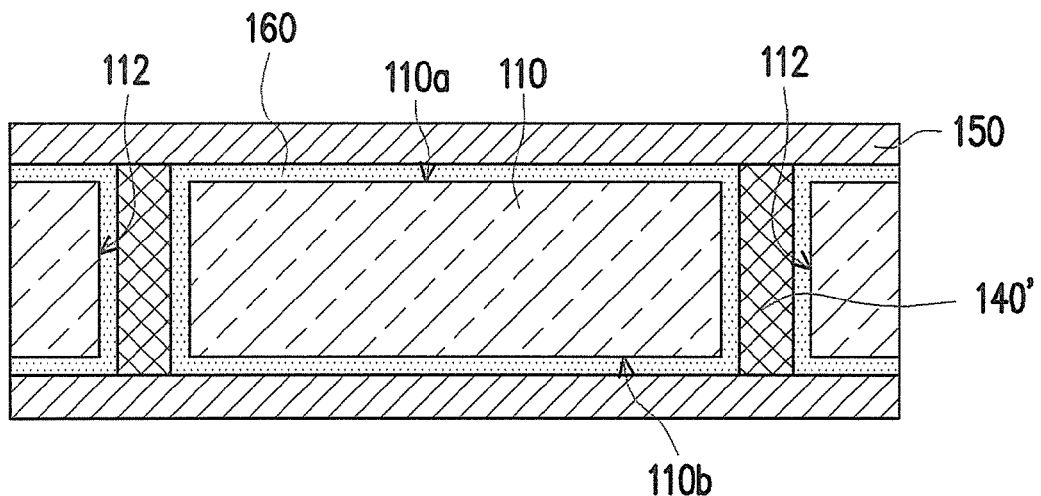

Thereafter, referring to FIG. 5, after the formation of the posts 140', a sputtering process and an electroplating process are performed through the conductive layer 160, so as to form a metal layer 150 on the upper surface 110a and the lower surface 110b. Here, the metal layer 150 can be made of TiW having a thickness of 800 Å~1000 Å and gold having a thickness of 1 μm~3 μm.

Figure 6:
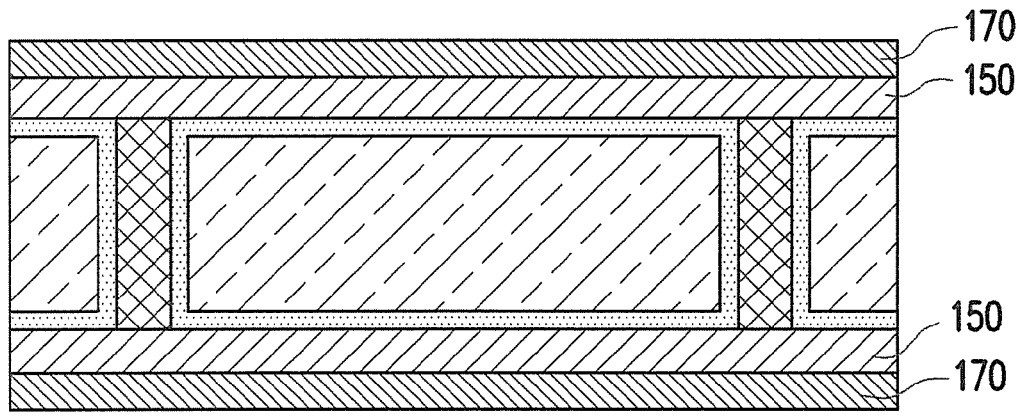
Figure 7:
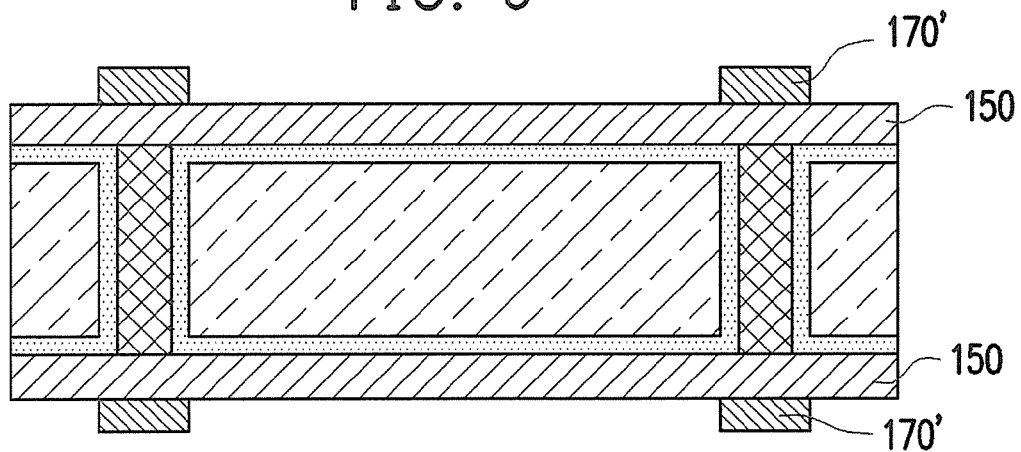
Figure 8:
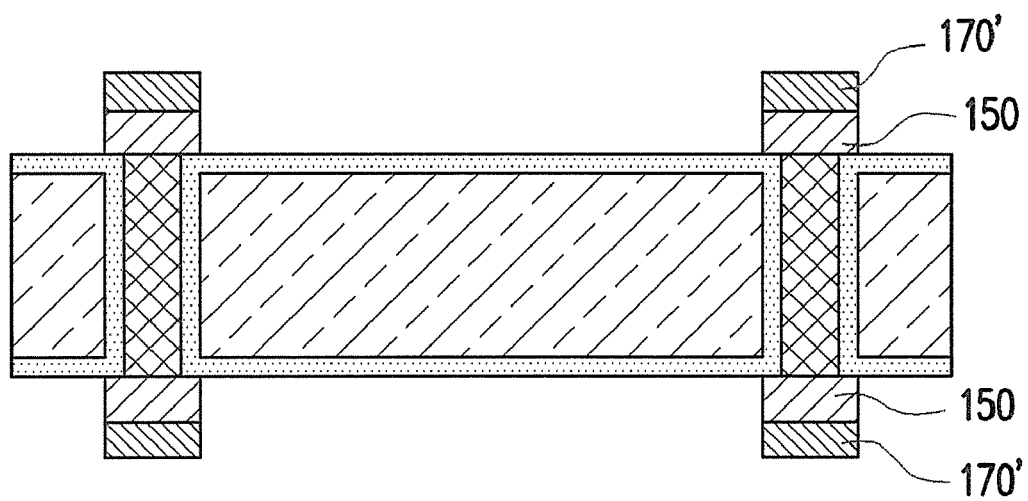
Figure 9:
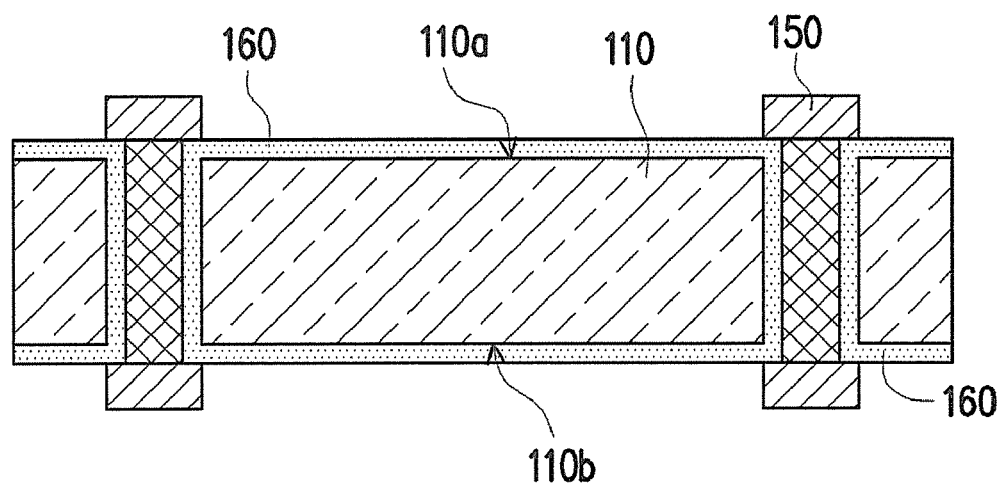
Figure 10:
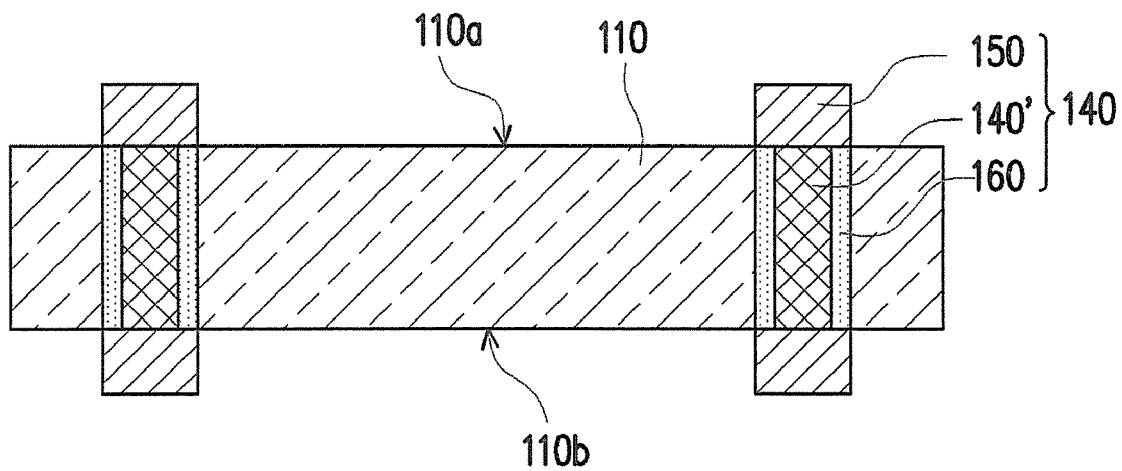

The metal layer 150 is then patterned. Referring to FIGS. 6 and 7, a photoresist layer 170 is formed on the metal layer 150, and an exposure and development process is performed on the photoresist layer 170 for forming a patterned photoresist layer 170'. After that, as indicated in FIGS. 7 and 8, the metal layer 150 outside the patterned photoresist layer 170' is etched with use of the patterned photoresist layer 170' as an etching mask, and the patterned photoresist layer 170' is then removed. Finally, referring to FIGS. 9 and 10, parts of the conductive layer 160 are removed, wherein said parts of the conductive layer 160 are respectively located on the upper surface 110a and the lower surface 110b of the transparent substrate 110. So far, the conductive posts 140 composed of a portion of the metal layer 150, the conductive layer 160, and the posts 140' are substantially formed.

Figure 11:
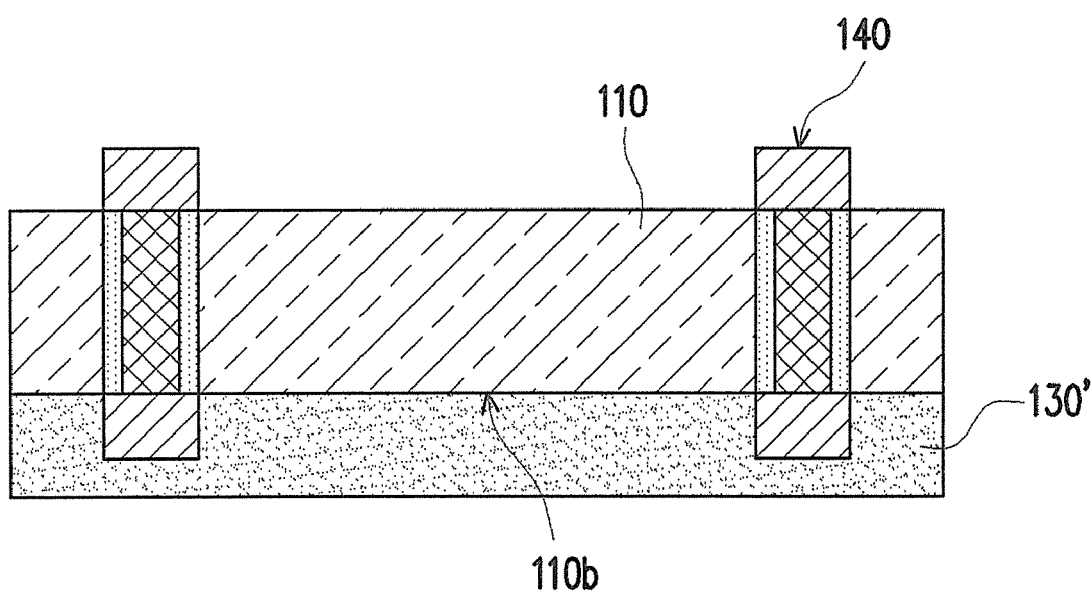
Figure 12:
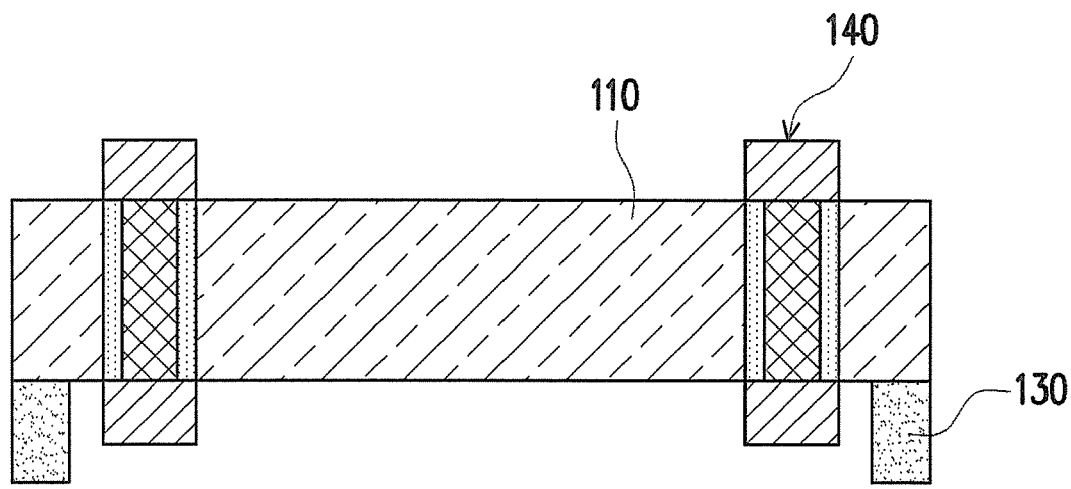

As shown in FIGS. 11 and 12, a sealing ring 130 is then formed on the lower surface 110b of the transparent substrate 110. In order to form the sealing ring 130 according to the present embodiment, a supporting layer 130' is first formed on the lower surface 110b of the transparent substrate 110, and the supporting layer 130' is then patterned for forming the sealing ring 130 which surrounds the lower surface 110b of the transparent substrate 110. In the present embodiment, the supporting layer 130' can be made of BCB and has a thickness of 15 μm~25 μm for example.

Figure 13:
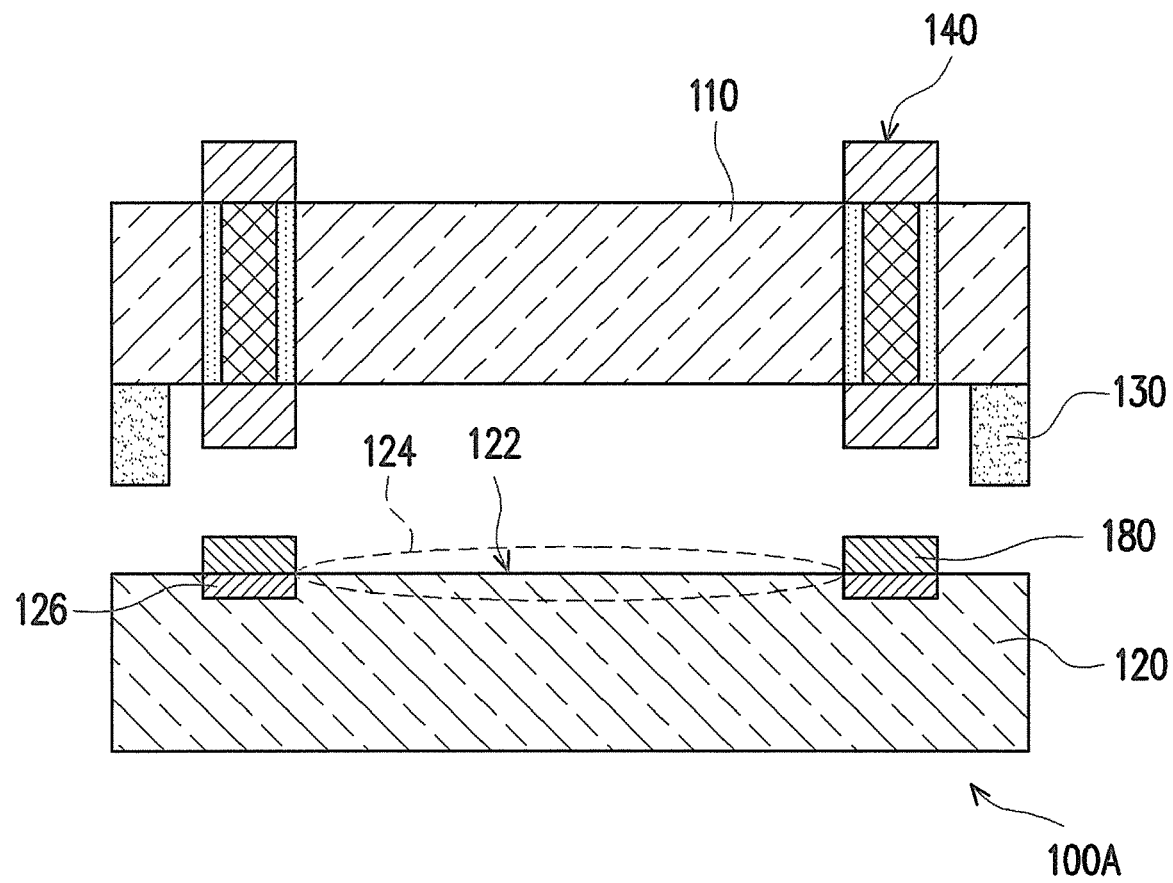
Figure 14:
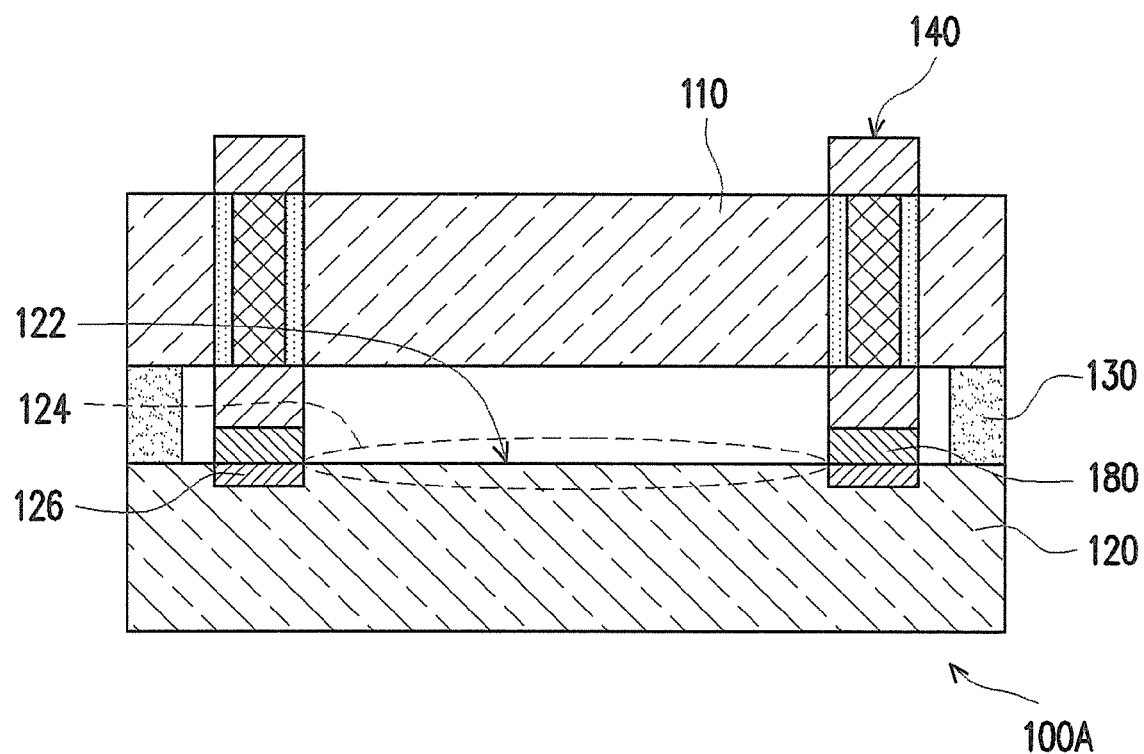

Next, referring to FIG. 13, a chip 120 is provided. In the present embodiment, the chip 120 has an active surface 122, an image sensitive area 124, and a plurality of die pads 126. The image sensitive area 124 and the die pads 126 are located on the active surface 122. A plurality of conductive bumps 180 are then formed. The conductive bumps 180 are respectively disposed on the die pads 126 for respectively connecting the conductive posts 140. As indicated in FIG. 14, the active surface 122 of the chip 120 is then turned to face toward the lower surface 110b of the transparent substrate 110, and the chip 120 is assembled to the transparent substrate 110 by wafer to wafer bonding. Here, the chip 120 is electrically connected with the conductive posts 140 through the conductive bumps 180 disposed on the die pads 126, and the sealing ring 130 surrounds the image sensitive area 124 and the die pads 126. Up to this point, all the steps for forming an image sensor chip package structure 100A are substantially completed.

In light of the foregoing, the chip is electrically connected with the conductive posts disposed within the through holes of the transparent substrate via the die pads or the conductive bumps disposed on the die pads according to the invention. Thereby, the space required by the conventional wire bonding can be reduced, and the entire volume and thickness of the image sensor chip package structure can also be decreased. Meanwhile, signals are transmitted between the transparent substrate and the chip through the conductive posts, and therefore circuits on the ceramic base are not required for signal transmission in the invention. As such, a circuit layout of the image sensor chip package structure can be simplified according to the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An image sensor chip package method, comprising:
   providing a transparent substrate having an upper surface, a lower surface, and a plurality of through holes, wherein the through holes pass through the transparent substrate;
   forming a plurality of conductive posts in the through holes;
   forming a sealing ring on the lower surface of the transparent substrate;
   providing a chip having an active surface, an image sensitive area, and a plurality of die pads, wherein the image sensitive area and the die pads are located on the active surface;
   forming a plurality of conductive bumps respectively disposed on the die pads for respectively connecting the conductive posts; and
   turning the active surface of the chip to face toward the lower surface of the transparent substrate and assembling the chip to the transparent substrate, wherein the chip is electrically connected with the conductive posts via the die pads, and the sealing ring surrounds the image sensitive area and the die pads.

2. The method as claimed in claim 1, wherein before the conductive posts are formed, the method further comprises:
   forming a conductive layer in the through holes and on the upper surface and the lower surface of the transparent substrate;
   forming a plurality of posts in the through holes that are filled with the posts, respectively; and
   performing a sputtering process and an electroplating process through the conductive layer for forming the conductive posts.

3. The method as claimed in claim 2, wherein a method of forming the conductive layer comprises sputtering.

4. The method as claimed in claim 2, wherein a material of the conductive layer comprises titanium tungsten (TiW) and copper.

5. The method as claimed in claim 2, wherein the step of forming the conductive posts in the through holes comprises:
   forming a photoresist layer on a metal layer through the conductive layer;
   performing an exposure and development process on the photoresist layer to form a patterned photoresist layer;
   etching the metal layer outside the patterned photoresist layer with use of the patterned photoresist layer as an etching mask, so as to form the conductive posts;
   removing the patterned photoresist layer; and
   removing parts of the conductive layer, wherein said parts of the conductive layer are respectively located on the upper surface and the lower surface of the transparent substrate.

6. The method as claimed in claim 1, wherein the step of forming the sealing ring on the lower surface of the transparent substrate comprises:
   forming a supporting layer on the lower surface of the transparent substrate; and
   patterning the supporting layer to form the sealing ring surrounding the lower surface of the transparent substrate.

7. The method as claimed in claim 6, wherein a material of the supporting layer comprises benzocyclobutene (BCB).

8. The method as claimed in claim 1, wherein a material of the conductive bumps comprises gold.

9. The method as claimed in claim 1, wherein a material of end portions of the conductive posts comprises gold.

10. The method as claimed in claim 1, wherein a material of the transparent substrate comprises glass.

11. The method as claimed in claim 5, wherein the metal layer is a composite layer, and a material of the metal layer comprises a titanium-tungsten (TiW) layer and a copper layer or a titanium-tungsten (TiW) layer and a gold layer.

\* \* \* \* \*